United States Patent [19]

Slaughter

[11] Patent Number: 4,504,786
[45] Date of Patent: Mar. 12, 1985

[54] SIGNAL DETECTOR

[76] Inventor: Grimes G. Slaughter, 240 N. Purdue Ave., Apt. 211, Oak Ridge, Tenn. 37830

[21] Appl. No.: 387,945

[22] Filed: Jun. 14, 1982

[51] Int. Cl.³ .......................................... G01R 23/02
[52] U.S. Cl. .............................. 324/78 R; 324/78 D; 324/79 R; 324/83 D
[58] Field of Search ............... 324/76 A, 78 D, 78 E, 324/78 J, 78 R, 79 D, 83 D, 83 R, 140 D, 140 R, 79 R

[56] References Cited

U.S. PATENT DOCUMENTS

| | | | |
|---|---|---|---|
| 3,636,446 | 1/1972 | Genter et al. | 324/79 R |
| 3,665,304 | 5/1972 | Maybach | 324/140 R |
| 3,820,021 | 6/1974 | Clarisse | 324/79 D |
| 4,021,653 | 5/1977 | Sharp et al. | 324/79 D |
| 4,068,210 | 1/1978 | Corkhill | 324/83 D |
| 4,178,631 | 12/1979 | Nelson, Jr. | 324/83 D |
| 4,364,046 | 12/1982 | Ogasawara et al. | 324/79 D |

OTHER PUBLICATIONS

Intro. to the Theory & Design of Active Filters, Huelsman et al., 1980, pp. 360-379.

Primary Examiner—Stewart J. Levy
Attorney, Agent, or Firm—Luedeka & Neely

[57] ABSTRACT

The specification discloses a circuit and method for detecting the presence and phase of a particular frequency in an input signal. The input signal is applied to the inputs of two linear multipliers and the other inputs of the multipliers are the inphase and quadrature phases of an interrogating signal produced by a fixed-frequency oscillator. The outputs of the multipliers are integrated over a selected time interval by two integrators and the outputs of the integrators are analyzed to determine the presence of the interrogating frequency in the input signal and to determine phase information regarding that portion of the input signal at the interrogation frequency relative to the interrogating signal.

21 Claims, 12 Drawing Figures

SIGNAL DETECTOR

The present invention relates to circuits for detecting the presence of a selected signal in an input signal and particularly relates to a detector for detecting the presence and phase of a signal of a selected frequency in an input signal by multiplying the input signal by an inphase interrogation signal and by a quadrature phase interrogation signal, integrating the two multiplied signals and analyzing the two integrated signals.

The conventional method of frequency decoding or identifying the presence of a frequency of interest in a waveform consisting of a mixture of unknown frequencies is to use multi-section filters to isolate the frequency and to convert the isolated frequency to a direct current logic level by rectification. The multi-section filters may be lumped LC, active, switched capacitor, or other types. Sometimes the frequencies are separated into groups by high and low pass filters, with the tones then being recognized by other filters or frequency decoders, or by correspondence with phase locked loops running at the desired frequency. In this type of application, only a logic level is desired as an output. The waveform itself is essentially discarded.

In some of these devices, in-band interference cannot be tolerated. The approach of using multi-section filters is inherently expensive, since the values of many circuit elements in the filters must be controlled to a high degree of precision for the filters to have sharp enough cut-offs.

As a general rule, it is easier to generate a particular frequency than to detect its presence. In the present invention, the desired frequency is generated, and the presence of it in the unknown waveform is determined by the application of the continuous finite Fourier Transform. In accordance with the present invention, a frequency detector for detecting the presence of a selected interrogation frequency in an input signal utilizes a fixed-frequency oscillator, which may be crystal-referenced, for generating the interrogation signal at a selected interrogation frequency. The interrogation signal and the input signal are applied to a first multiplier to produce a first multiplier signal which is applied as an input to a first integrator. The integrator integrates the first multiplier signal over a predetermined time interval to produce a first integration signal, and the first integration signal is analyzed to determine the presence or absence of the selected interrogation frequency in the input signal.

Assuming that the input signal includes a signal with the selected interrogation frequency, and assuming that the phase difference or angle between the interrogation signal and the input signal is not 90°, the first integration signal will have a positive or negative value other than zero if the selected interrogation frequency is present in the input signal. If the input signal does not include a signal component with the interrogation frequency, then, assuming a sufficiently long integration time, the first integration signal will be zero (within a range defined as zero). The zero integration signal indicates the absence of the interrogation frequency or it may indicate that the interrogation signal and that portion of the input signal at the selected interrogation frequency are phase shifted by an angle of 90°.

To overcome the possibility that a zero integration signal is caused by a 90° phase angle between that portion of the input signal at the interrogation frequency and the interrogation signal, the input signal should be compared with the inphase interrogation signal and the quadrature phase interrogation signal. It is impossible for both the inphase and the quadrature phase of the interrogation signal to have a 90° phase angle with respect to that portion of the input signal at the selected interrogation frequency.

Thus, in accordance with the present invention, the frequency detector described above may further include a phase shifter for receiving the interrogation signal and producing a 90° phase shifted interrogation signal. A second multiplier receives the input signal and the ninety degree phase shifted interrogation signal and produces a second multiplier signal which is applied to the input of a second integrator. The second multiplier signal is integrated by the second integrator over the same predetermined time interval to produce a second integration signal. The first and second integration signals are then analyzed to determine the presence of the selected interrogation frequency in the input signal and to generate a detection signal to indicate such presence. If either of the first or second integration signals have a non-zero absolute value, then the detection signal will be generated to indicate the presence of the selected interrogation frequency in the input signal.

Assuming that the selected interrogation frequency will appear in the input signal for a relatively long period of time, the input signal may be multiplied with the in phase and quadrature phase of the interrogation signal using the same multiplier and integrator by taking two rapidly successive samples of the signal. First, the in phase interrogation signal would be multiplied with the input signal and interrogated over the predetermined time interval, and the integrator would be read, the magnitude held in a memory, and the integrator reset. Then, the quadrature phase of the integration signal could be applied to the input of the first multiplier so that the quadrature phase and the input signal are multiplied, and the integrator would integrate this multiplier signal over the same predetermined time interval. At the end of the time interval, the integrator would be sampled, and this sample value would correspond to the quadrature phase sample that was previously described as being produced at the output of the second integrator. Thus, if the output of the first integrator is non-zero in either of the inphase or quadrature phase samples, then the presence of the selected interrogation frequency in the input signal is indicated.

Numerous circuits may be utilized to analyze the outputs of the first and second integrators to determine information regarding the input signal. The "vector sum" of the outputs $((A^2+B^2)^{\frac{1}{2}})$ is, perhaps, the most physically meaningful parameter. Thus, the frequency detector may include first and second squaring circuits for receiving and squaring the first and second integration signals, respectively, to produce first and second squared signals. An adding circuit adds the first and second squared signals to produce a sum signal, and a square root circuit takes the square root of the sum signal to produce a vector sum signal having a magnitude corresponding to the magnitude of the input signal and the interrogation signal. Since the magnitude of the interrogation signal is known, the vector sum signal corresponds in a known manner to the magnitude of the input signal.

The "vector sum" analysis may be implemented rapidly by utilizing the additive properties of sinusoids. That is, the algebraic sum of two sine wave outputs multiplied, respectively, by the inphase and quadrature phase interrogation signals would correspond to the vector sum of the vector representations of the sine wave outputs. Thus, the frequency detector described above may further include a third multiplier for multiplying the first integration signal and the interrogation signal to produce a third multiplier signal, and a fourth multiplier is provided for multiplying the second integration signal and the 90° phase shifted interrogation signal to produce a fourth multiplier signal. If the input signal includes the interrogation signal frequency, then the outputs of the third and fourth multipliers will be sine waves. A summer adds the third and fourth multiplier signals to produce a sum signal corresponding in magnitude to the magnitude of the signal component of the input signal having the interrogation frequency. The sum signal is applied to the input of a rectifier and rectified to determine the peak magnitude of the sum signal.

A comparison of the first and second integration signals, one with the other or with the vector sum of the first and second integration signals, reveals the phase angle between the interrogation signal and the interrogation frequency appearing in the input signal. Circuitry for determining such phase angle as well as additional circuitry for analyzing the first and second integration signals to determine the presence of the interrogation frequency in the input signal are disclosed in the following Detailed Description.

Both the center frequency and the integrating time (band width) of the present circuit can be determined externally, such as by programmable counters, and both of these parameters can be changed rapidly. Thus, one circuit can be multiplexed to detect the presence of several frequencies, by successively changing the interrogating frequency and, if necessary, the integrating time. There must be sufficient time to resolve the frequencies from each other, and the integrator gain must be made approximately inversely proportional to the integrating time so that the integrators do not overload. For central office applications, the frequencies can be generated once and bussed to many decoding circuits.

The present invention may best be understood by reference to following detailed description of exemplary embodiments when considered in conjunction with the drawings in which.

Figure 1:
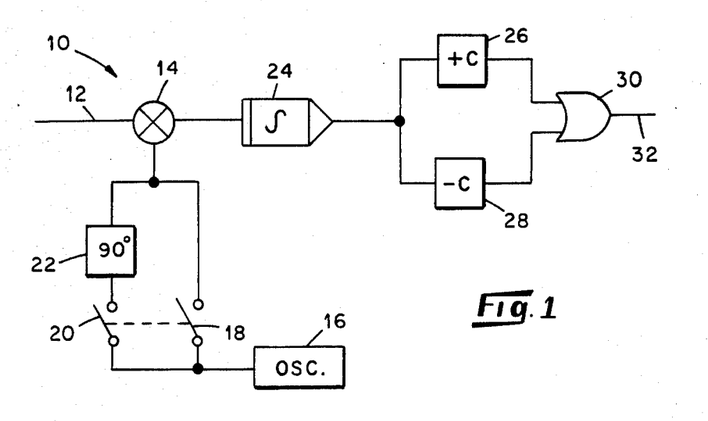
FIG. 1 is a schematic diagram of a detector circuit in which an input signal is multiplied by an oscillator signal and integrated over a predetermined time interval to determine the presence of a selected frequency in the input signal.

Referring now to the drawings in which like reference characters designate like or corresponding parts throughout the several views, there is shown in FIG. 1, a detector circuit 10 embodying the present invention. The function of circuit 10 is to detect the presence of a selected frequency in an input signal which is applied thereto on line 12 to an input of the multiplier 14. The other input to the multiplier 14 is supplied by oscillator 16 through either switch 18 or through switch 20 and a 90° phase shifter 22. The oscillator 16 produces a sinusoidal signal at the selected frequency (also referred to herein as the "interrogation frequency") to be detected by the circuit 10. The output of the multiplier 14 is applied to the input of an integrator 24 whose output is applied to a positive comparator 26 and a negative comparator 28. The outputs of the comparators 26 and 28 are applied to the inputs of an "or" gate 30, and the output of gate 30 on line 32 is the output of the circuit 10.

As shown in FIG. 1, the output of the oscillator 16 is transmitted through a switch 18 to the other input of the multiplier 14 and is multiplied by the input signal. If the input signal does not contain the interrogation frequency, (the frequency of oscillator 16) then the output of the multiplier 14 will eventually integrate to zero. In such case, assuming that a sufficiently long integration interval has been chosen, the output of integrator 24 will be zero (within a selected range of zero), and there will be no output of the circuit 10 on line 32. Thus, the circuit would indicate the absence of the interrogation frequency and the input signal.

Assuming that the interrogation frequency is present in the input signal and that the phase angle between the interrogation signal generated by oscillator 16 and that portion of the input signal having the interrogation frequency is not ninety or two hundred seventy degrees, then the output of the multiplier 14 will not integrate to zero over a period of time but will be between positive and negative limits. Thus, assuming the interrogation frequency is present in the input signal and that the aforementioned phase angle is not 90° or 270°, then the integrator 24 will produce an output, either positive or negative, and either the positive comparator 26 or the negative comparator 28 will detect such signal and produce an output. In response to an output from comparator 26 or 28 the "or" gate 30 will produce a signal on line 32 to indicate the presence of the interrogation frequency in the input signal.

If upon one sampling of the input signal, the circuit 10 indicated that the interrogation frequency was not present, such indication could have been caused by a 90° or 270° phase angle between that portion of the input signal at the interrogation frequency and the interrogation signal. To check for this possibility, the input signal should be reinterrogated using a new interrogation signal that is 90° phase shifted with respect to the former interrogation signal. To accomplish this second interrogation, switch 18 is opened and switch 20 is closed so that the interrogation signal from the oscillator 16 is applied through switch 20 and the 90° phase shifted interrogation signal on the second interrogation. If a zero output at the "or" gate 30 was produced on the first interrogation by the fact that the input signal and the interrogation signal had a phase angle of 90° or 270°, the 90° phase shifted interrogation signal would not have a 90° or 270° phase angle relative to the input signal and, thus, the presence of the interrogation frequency in the input signal should cause an output on line 32 to indicate such presence.

Figure 2:
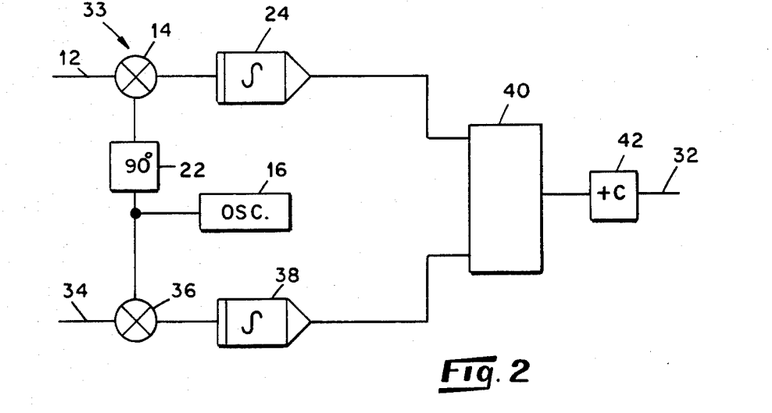
FIG. 2 is a schematic diagram of a detector circuit in which an input signal is multiplied by the inphase and the quadrature phase of a oscillator signal and the two multiplier signals are integrated over a predetermined time interval and analyzed to determine the presence or absence of a selected frequency in the input signal.

Referring now to FIG. 2, there is shown a detector circuit 33 that simultaneously interrogates the input signal with the inphase and the quadrature phase of the interrogating signal. In this embodiment, the input signal is applied on lines 12 and 34 to inputs of multipliers 14 and 36, respectively. The other input of the multiplier 14 is supplied by the output of oscillator 16 through a 90° phase shifter 22, while the other input of the multiplier 36 is supplied directly by the output of the oscillator 16.

The outputs of multipliers 14 and 36 are applied to integrators 24 and 38, respectively, and the outputs of the integrators 24 and 38 are applied to a combining circuit 40. The output of the combining circuit 40 is applied to a positive comparator 42 that produces a logic level signal on line 32 which is the output of the circuit 33.

In circuit 33, the input signal is being multiplied simultaneously with the interrogating frequency (inphase) and with the interrogating frequency phase shifted by ninety degrees (quadrature phase). Thus, if the interrogating frequency is present in the input signal, one of the integrators 24 or 38 must produce an output that is other than zero. It is possible that the phase angle between the interrogating signal and the input signal will be ninety degrees or 270 degrees so that one of the integrators 24 or 38 may indicate a zero output even in the presence of the interrogating frequency in the input signal, but in such case, the other of the integrators 24 and 38 would not have a zero output. For example, assume that the quadrature phase interrogating signal applied to the input of multiplier 14 has a 90° phase angle with respect to the interrogation frequency found in the input signal on line 12. In such case, integrator 24 would provide a zero output, but the inphase interrogating signal applied to multiplier 36 must be at a zero degree (or 180 degree) phase angle with respect to the interrogating frequency in the input signal. Thus, the output of the integrator 38 will be a maximum positive or negative value. The combining circuit 40 recognizes that a zero output from one integrator, such as integrator 24, and a non-zero output from the other integrator 38, would indicate the presence of the interrogation frequency in the input signal.

Figure 7:
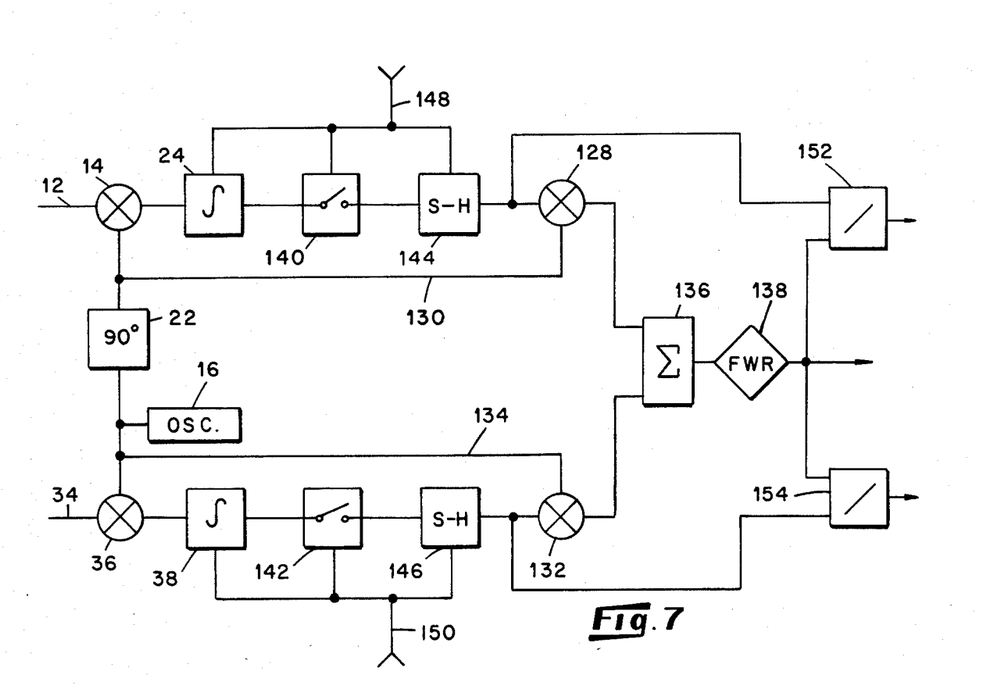
FIG. 7 is a detector circuit that determines the presence or absence of a selected frequency in an input signal and determines phase information regarding that portion of the input signal at the selected frequency.

It will be understood that the circuits shown in FIGS. 1 and 2 have been simplified for clarity of illustration and that the actual operating circuits must include conventional control circuitry such as appropriate timing, switching and sample and hold circuitry such as partially shown in FIG. 7. The circuits 10 and 33 in many applications would be interfaced with a computer that would control the sampling and timing of the circuits as well as receive the output thereof.

Reference to the forward Fourier Transform, which extracts the frequency domain structure of a time varying function, reveals mathematically the reason the outputs of multipliers 14 and 36 will integrate to zero when: (1) the interrogation frequency is not present in the input signal, or (2) the interrogation frequency in the input signal is 90° or 270° phase shifted with respect to the interrogation signal.

The forward Fourier Transform, which extracts the frequency domain structure of a time varying function, where $S_x$ is the Fourier coefficient for the content of frequency $f_s$ in the time varying wave form x (t) is given by:

$$S_x(f_s) = \int_{-\infty}^{\infty} x(t) \left(\cos(2\pi f_s t) + i \cdot \sin(2\pi f_s t)\right) dt,$$

In the present case x (t) will be the sum of sine waves of various frequencies and arbitrary phases with respect to the interrogating frequency $f_s$. However, it is sufficiently general to state x (t)

$$x(t) = \Sigma(\sin(2\pi f_i t) + \cos(2\pi f_j t) + \sin(2\pi f_k t) + ....).$$

The integration limits of plus and minus infinity as indicated are, of course, completely impractical. In the present invention, the limits will be changed to encompass tens of cycles of the interrogating frequency $f_s$. In general, the band width is inversely proportional with the integration time as discussed hereinafter.

The product terms to be integrated are of the forms:

$$\sin(2\pi f_i t) \cdot \sin(2\pi f_s t); \cos(2\pi f_j t) \cdot \cos(2\pi f_s t); \sin(2\pi f_k t) \cdot \cos(2\pi f_s t).$$

These can be transformed to the respective forms:

$$\tfrac{1}{2}\cos(2\pi t(f_i - f_s)) - \tfrac{1}{2}\cos(2\pi t(f_i + f_s))$$

$$\tfrac{1}{2}\cos(2\pi t(f_j - f_s)) + \tfrac{1}{2}\cos(2\pi t(f_j + f_s))$$

$$\tfrac{1}{2}\sin(2\pi t(f_k - f_s)) + \tfrac{1}{2}\sin(2\pi t(f_k + f_s)).$$

and, the corresponding indefinite integrals are:

$$\frac{\tfrac{1}{2}\sin(2\pi t(f_i - f_s))}{2\pi(f_i - f_s)} - \frac{\tfrac{1}{2}\sin(2\pi t(f_i + f_s))}{2\pi(f_i + f_s)}$$

$$\frac{\tfrac{1}{2}\sin(2\pi t(f_j - f_s))}{2\pi(f_j - f_s)} + \frac{\tfrac{1}{2}\sin(2\pi t(f_j + f_s))}{2\pi(f_j + f_s)}$$

$$\frac{-\tfrac{1}{2}\cos(2\pi t(f_k - f_s))}{2\pi(f_k - f_s)} - \frac{\tfrac{1}{2}\cos(2\pi t(f_k + f_s))}{2\pi(f_k + f_s)}.$$

It will be noted that the integrating factors and the denominators of the above equations of lefthand terms involve the frequency differences, while the righthand terms involve the frequency sums. Therefore, if the frequencies are very close, the lefthand terms are much larger than the righthand terms. In the limit $F_i = F_s$ the following asymptotic forms obtain for the products:

$$\tfrac{1}{2} - \tfrac{1}{2}\cos(2\pi \cdot 2f_s t)$$

$$\tfrac{1}{2} + \tfrac{1}{2}\cos(2\pi \cdot 2f_s t)$$

$$0 + \tfrac{1}{2}\sin(2\pi \cdot 2f_s t)$$

with the corresponding indefinite integrals:

$\frac{1}{2}t - \frac{1}{2}(\sin(2\pi \cdot 2f_s t))/4\pi f_s$ $\frac{1}{2}t + \frac{1}{2}(\sin(2\pi \cdot 2f_s t))/4\pi f_s$ $0 - \frac{1}{2}(\cos(2\pi \cdot 2f_s t))/4\pi f_s$ The right hand terms of the above integrals integrate to zero over time, leaving only those terms with a "DC offset" to contribute to the Fourier integral.

Thus, it may be observed that the Fourier Transform, if integrated over long periods of time, gives zero for all frequencies except those which correspond exactly to the interrogating frequency. If there is such a correspondence, then each of the interrogating frequency terms in the above equations gives an indefinite integral which is a linear function of the integration time multiplied by the cosine of the phase angle between the two wave forms. The integral can therefor vary from a positive maximum, through zero, to a negative maximum, depending on the relative phase angle. As discussed with regard to the circuits disclosed in FIGS. 1 and 2, the input signal may be interrogated with two signals of the same frequency, but being sinusoids in quadrature, to prevent the integration from being zero in both instances. Thus, assuming the interrogation frequency is present in the input signal, one of the interrogations will indicate the presence of such signal regardless of its phase. The "vector sum" (square root of the sum of the squares) of the two integration signals has been found to be an accurate quantitative indication of the presence of the interrogating frequency in the input signal.

Figure 3:
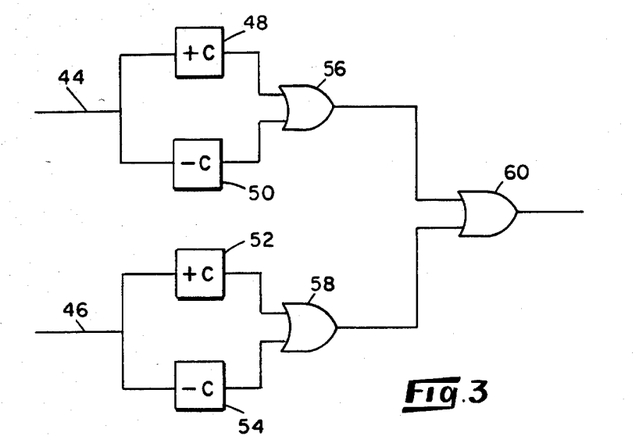
FIG. 3 is a schematic diagram of a combining circuit using multiple comparators to receive and analyze the outputs from the integrators as shown in FIG. 2.

Referring now to FIG. 3, there is shown a combining circuit that may be used as the combining circuit 40 shown in FIG. 2. As shown in FIG. 3, the integrator 24 produces an output that is applied through a line 44 to the inputs of a positive comparator 48 and a negative comparator 50. Likewise, the integrator 38 produces an output that is applied through line 46 to the inputs of a positive comparator 52 and a negative comparator 54. The comparators 48, 50, 52 and 54 are conventional in design and will produce at their output a logic level "one" when a signal is applied at their inputs above a predetermined threshold. The positive comparators will have a positive threshold and the negative comparators will have a negative threshold so that any signal occurring between the positive and negative thresholds will be deemed to be zero. A signal greater than the positive threshold will cause the positive comparator to produce a logic level "one" signal at its output, and a negative signal having an absolute value greater than the absolute valve of the negative threshold will cause the negative comparator to produce a logic level "one" output signal.

As previously described, if the input signal on line 12 or 34 includes the interrogation frequency, the output of integrator 24 or 38 or both will be other than zero. Thus, if the interrogating frequency is present in the input signal, then one or both of the integration signals applied on lines 44 and 46 will be other than zero. If a non-zero positive signal appears on line 44, comparator 48 will produce a logic level "one" output which is applied to the input of an "or" gate 56. Such input will cause the "or" gate 56 to produce a logic level "one" output which is applied to the input of an "or" gate 60 to similarly actuate it. Likewise, if a non-zero negative signal appeared on line 44, the negative comparator 50 would actuate the "or" gates 56 and 60.

Comparators 52 and 54 work in the same manner. A non-zero positive signal appearing on line 46 will cause comparator 52 to actuate the or gates 58 and 60, and a non-zero negative signal on line 46 will cause the negative comparator 54 to actuate "or" gates 58 and 60. Thus, a logic level "one" signal at the output of the "or" gate 60 will indicate the presence of the interrogating frequency in the input signal.

Figure 4:
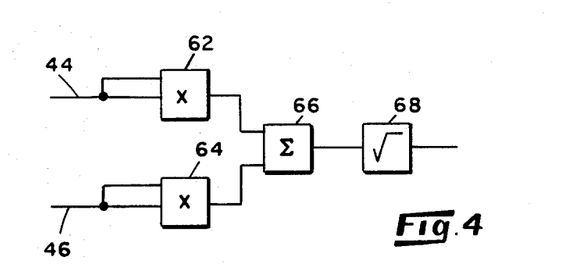
FIG. 4 is a schematic diagram of a combining circuit for determining the vector sum of the integrator outputs.

As previously mentioned, the vector sum of the integrator output is an accurate quantitative indication of the presence of the interrogating frequency in the input signal. In FIG. 4, a circuit is shown for determining such a "vector sum". The output of integrator 24 is applied through line 44 to both inputs of a multiplier 62 so that the multiplier 62 produces as its output the square of such integration signal. The output of integrator 38 is likewise applied to both inputs of a multiplier 64 so that the output of the multiplier 64 is the square of the integration signal produced by integrator 38. The outputs of both multiplier 62 and 64 are applied to a summing circuit 66 to provide the sum of the squares of the integration signals, and the output of the summing circuit 66 is applied to square root circuit 68 to provide the square root of the sum of the squares of the integration signals. That is, the square root circuit 68 provides the "vector sum" of the outputs of integrators 24 and 38 shown in FIG. 2.

Figure 5:
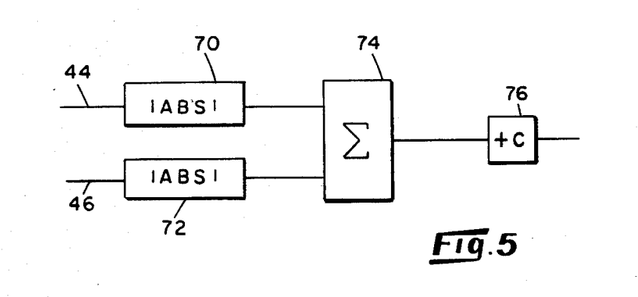
FIG. 5 is a combining circuit for determining the sum of the absolute values of the integrator outputs.

The sum of the absolute values of the outputs of integrators 24 and 38 likewise produces a reliable indication of the presence of the interrogating frequency in the input signal. In FIG. 5, a combining circuit is shown to implement such operation. The output of integrator 24 (FIG. 2) is applied through line 44 to an absolute value circuit 70 that produces as its output the absolute value of its input. Likewise, the output of integrator 38 (FIG. 3) is applied through line 46 to an absolute value circuit 72. The outputs of circuits 70 and 72 are applied as inputs to a summing circuit 74 which sums the values of the outputs of the absolute value circuits 70 and 72 and applies such summed value to the input of a comparator 76. When the output of the summing circuit 74 is greater than a preselected threshold value, the output of the comparator 76 will be a logic level "one" indicating the presence of the selected frequency in the input signal.

Figure 6:
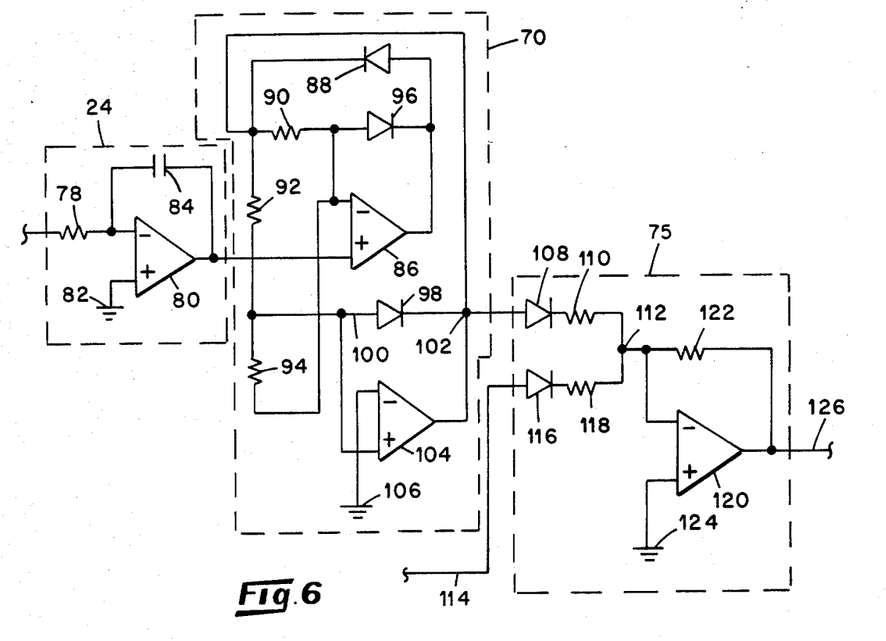
FIG. 6 is a combining circuit for selecting the greater of the absolute values of the integrator outputs.

Some elements of the circuit shown in FIG. 5 are shown in the greater detail in FIG. 6 in which there is depicted a somewhat diagrammatical schematic circuit of the integrator 24, the absolute value circuit 70 and a selector circuit 75. The integrator 24 shown in FIG. 6 is of conventional design having the input signal applied through a resistor 78 to the negative input of an amp 80. The positive input of the amp 80 is connected to a common terminal 82. The output of the amp 80 is connected to its negative input through a capacitor 84. The integrator 24 will be allowed to integrate for a predetermined time interval with the voltage at the output of the amplifier 80 indicating the result of such integration. After the predetermined time interval, the integrator 24 is sampled and reset in a conventional manner. For clarity, none of the circuit diagrams herein show such elements as integrator gates, stretchers, etc., but it will be understood that such functions are implemented in a conventional manner and should be considered subparts within the major blocks of circuitry disclosed in the FIGURES.

The output of the integrator 24 is applied to the absolute value circuit 70 which is a conventional absolute amplifier. The output of the integrator 24 is applied to the positive input of an amp 86 and the output of amp 86 is applied through a diode 88 and a resistor 90 in parallel with the series connection of resistors 92 and 94 to the negative input of the amp 86. A diode 96 is also connected, in a reverse orientation from the diode 88, between the output of amplifier 86 and the negative input of amp 86. The interconnection between resistor 92 and 94 is connected by line 100 through a diode 98 to the output line 102. An amplifier 104 has its positive input connected to line 100 and its output connected to output line 102. The negative input of amp 104 is connected to the common or ground 106. The output line 102 is also connected to the interconnection between resistor 90, resistor 92 and diode 88.

The output on line 102 represents the absolute value of the input from the integrator 24 and is applied to one input of a selector circuit 75. Thus, the output of the absolute value circuit 70 is connected through a diode 108 and a resistor 110 to a common 112.

The output of the absolute value circuit 72 (FIG. 5) is applied through line 114 as another input to the selector circuit 75 and is, thus, applied through a diode 116 and a resistor 118 to the common 112. The common 112 is connected to the input of an amp 120 and is connected through a resistor 122 to the output of the amp 120. The positive input of the amp 120 is connected to a ground or common 124, and the output of amp 120 on line 126 represents the greater of the two inputs applied to circuit 75 on lines 102 and 114.

Referring now to FIG. 7, there is shown a more detailed embodiment of the present invention that utilizes the above described "vector sum" method to determine the presence or the absence of the interrogation frequency in the input signal and also provides information on the phase angle between the local oscillator signal and the interrogation frequency found in the input signal. The construction of the circuit shown in FIG. 7 is substantially identical to the circuit shown in FIG. 2 with respect to the inputs on lines 12 and 34, and the interconnections between multipliers 14 and 36, oscillator 16, the 90° phase shifter 22 and the integrators 24 and 38. However, in the embodiment shown in FIG. 7, control, timing and sample and hold circuitry is shown which is present in the embodiments of FIGS. 1 and 2, but is not shown in such FIGURES to simplify the drawings and avoid undue repetition.

The outputs of the integrators 24 and 38 are applied, respectively, as inputs to switches 140 and 142, and the outputs of switches 140 and 142 are applied, respectively, as inputs to sample and hold circuits 144 and 146. The operation of the integrators 24 and 38, switches 140 and 142, and sample and hold circuits 144 and 146 is controlled by control and timing signals applied by lines 148 and 150. Such control and timing signals are preferably computer generated but may also be generated by dedicated circuits.

In operation, the integrators 24 and 38 are allowed to integrate their input signals over a selected time period and after such period a signal is applied on lines 148 and 150, respectively, to reset the integrators 24 and 38. The control signal thus applied to lines 148 and 150 also causes the switches 140 and 142 to close and then reopen and the sample and hold circuits 144 and 146 to resample and hold the new input. The timing is chosen such that switches 140 and 142 close, sample and hold circuits 144 and 146 sample the outputs of the switches 140 and 142, respectively, and the switches 140 and 142 reopen, all, after the selected time period of integration but immediately before the integrators 24 and 38 are reset to zero.

The outputs of the sample and hold circuits 144 and 146 are applied, respectively, as inputs to multipliers 128 and 132. The other input of the multiplier 128 is supplied by the output of the 90° phase shifter 22, and the other input of the multiplier 132 is supplied by the output of the oscillator 16. Thus, multiplier 132 receives the inphase interrogation signal and multiplier 128 receives the quadrature phase interrogation signal. The sine wave outputs of the multipliers 128 and 132 are applied to a summing circuit 136 which adds the two sinusoidal signals together and produces an output corresponding to the sum of such signals. The output of the summing circuit 136 is applied to a full wave rectifier 138 whose output corresponds to the vector sum of the outputs of integrators 24 and 38.

The above described circuitry for determining the vector sum of the outputs of integrators 24 and 38 is an inexpensive and rapid manner in which to determine the "vector sum". This circuitry utilizes the additive properties of sinusoids. The integrator outputs of integrators 24 and 38 control the amplitudes of two sine waves in quadrature (the inphase and quadrature phase of the interrogation signal produced by oscillator 16) by means of the two multipliers 128 and 132. Then, the summing circuit 136 provides the algebraic sum of the sine waves appearing at the outputs of the multipliers 128 and 132. The algebraic sum of the sine waves corresponds to the vector sum of the vector representations found at the output of the integrators 24 and 38. The amplitude of the algebraic sine waves sum is obtained by rectification using the full wave rectifier 138.

Any non-zero output of the full wave rectifier 138 indicates the presence of the interrogation frequency in the input signal appearing on lines 12 and 34 and the magnitude of such rectifier output corresponds to the absolute vector magnitude of that portion of the input signal at the interrogation frequency. The filtered output of filter and rectifier 138 (a d.c. level) is applied as an input to dividers 152 and 154 as the denominator of the division performed thereby. The other input of divider 152 is the output of sample-hold 144 which is used as the numerator of the division performed in divider 152. The other input to divider 154 is the output of sample-hold 146 which is used as the numerator of division performed by the divider 154. Since the output of sample-hold 144 corresponds to the imaginary vector portion of, and the output of sample-hold 146 corresponds to the real vector portion of, the vector whose absolute amplitude appears as the output of rectifier 138, the output of divider 152 corresponds to the sine of, and the output of divider 154 corresponds to the cosine of, the phase angle or phase difference between that portion of the input signal at the interrogation frequency and the interrogation signal produced by oscillator 16. Thus, the outputs of dividers 152 and 154 contain signed phase information regarding that portion, if any, of the input signal at the interrogation frequency.

It will be understood that the ratio formed by the output of sample-hold 144 divided by the output of sample-hold 146 would provide the tangent of the aforementioned phase angle and an alternate embodiment of the invention could provide a divider to produce an output corresponding to the tangent of the phase angle. However, since the tangent would go to infinity at a phase angle of 90°, special circuitry would be needed to interpret the phase angle when it was at or approaching 90° and it would be necessary to protect the divider that would attempt to produce an infinity signal at a 90° phase angle. For these reasons it is preferred to use the cosine or sine function to determine phase information, but it is appreciated that such phase information may be derived using any two of the outputs of the rectifier 138, the divider 152 or the divider 154.

Figure 8:
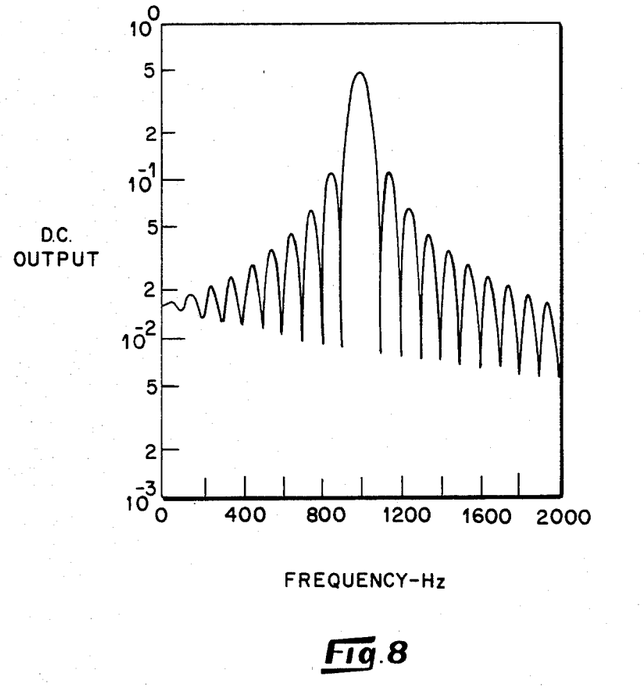
FIG. 8 is a graph of the "vector sum" output of the circuits of FIGS. 2, 4 and 7.
Figure 9:
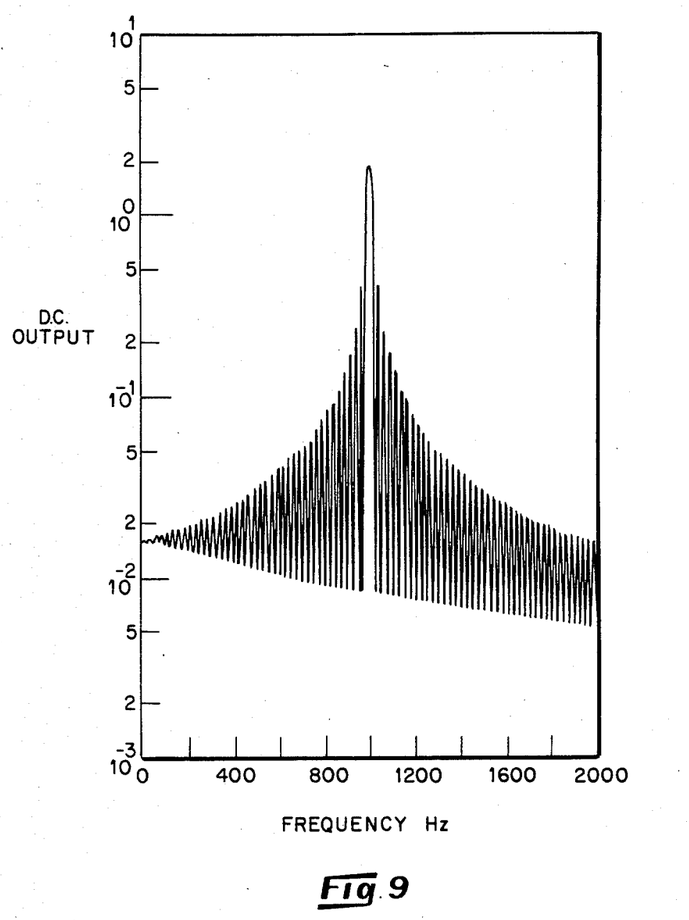
FIG. 9 is a graph of the output of the circuit of FIGS. 2, 4 and 7 for a range of input frequencies from 0 to 2,000 hertz with an interrogating frequency of 1,000 hertz and an integration time of 40 cycles of the interrogating frequency.

The quantitative performance of the decoding circuits described above are graphed in FIGS. 8–12. FIG. 8 is a computer calculation of the "vector sum" output of the circuit described in conjunction with FIGS. 2, 4 and 7. FIG. 8 discloses the output of the circuit over a range of frequencies from 0 to 2,000 hertz for an interrogating frequency of 1,000 hertz, integrated for 10 cycles of the integrating frequency. Note that the half band width is given approximately by the interrogation frequency divided by the number of cycles of integrating time. FIG. 9 graphs the output of the circuit for a range of frequencies from 0 to 2,000 hertz for an interrogating frequency of 1,000 hertz integrated for 40 cycles of the interrogating frequency. By comparison of FIGS. 8 and 9, it will be appreciated that increasing the integrating time decreases the band width and that the integrating time must include many cycles of the interrogating frequency in order to establish the presence or absence of the frequency accurately.

Figure 10:
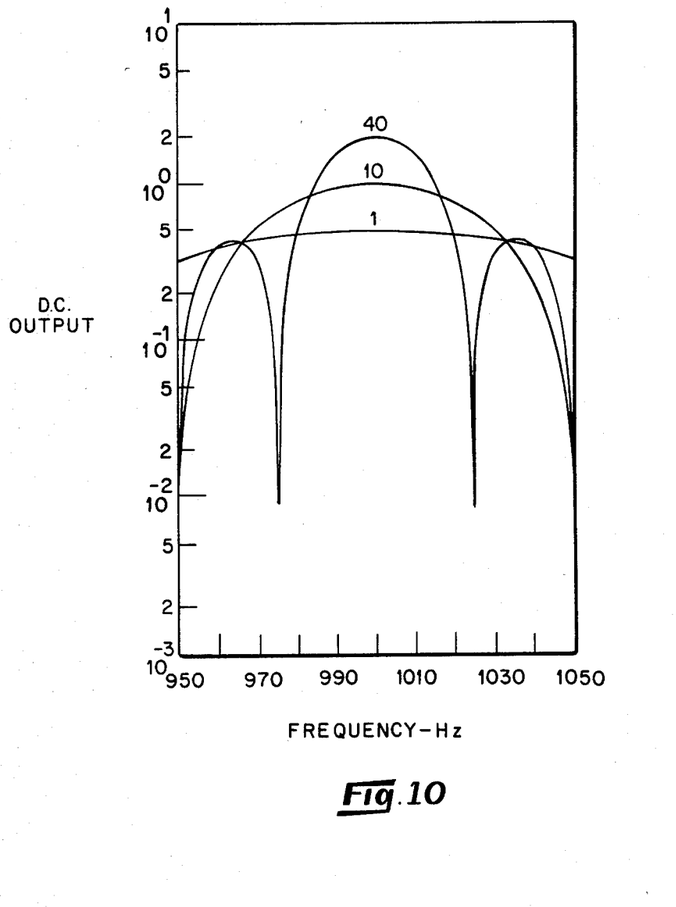
FIG. 10 is a graph of the circuit vector response for integrating times of 1, 10 and 40 cycles of the interrogating frequency.

FIG. 10 graphs the vector sum response of the circuit for integrating times of 1, 10 and 40 cycles of the interrogating frequency shown in a more restricted frequency range from 950 to 1,050 hertz. Again the inverse relationship between the integrating time and the bandwidth is evident.

Figure 11:
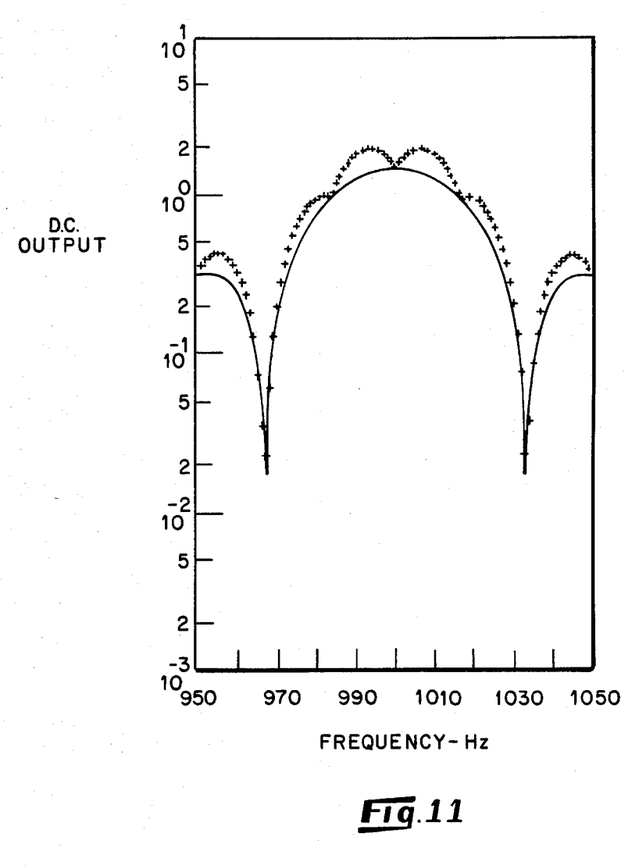
FIG. 11 is a graph comparison of the vector sum (—) and sum of absolute values (+) responses of the circuits of the present invention; and, FIG. 12 is a graph comparison of the greater of the absolute values (+) and vector sum (—) responses of the circuits of the present invention.

FIG. 11 depicts in a solid line the "vector sum" response of the circuit, and the sum of the absolute values of the integrators 24 and 38 is depicted by plus symbols. It will be appreciated that the sum of the absolute values of the integrator outputs is equal to or greater than the "vector sum". In FIG. 11, both the vector sum and the sum of the absolute values of the integrator outputs is shown for an integrating time of 30 cycles. The response function using the sum of the absolute values is not very desirable because there is a sharp dip at the center frequency where rapid phase shifts are occuring.

Figure 12:
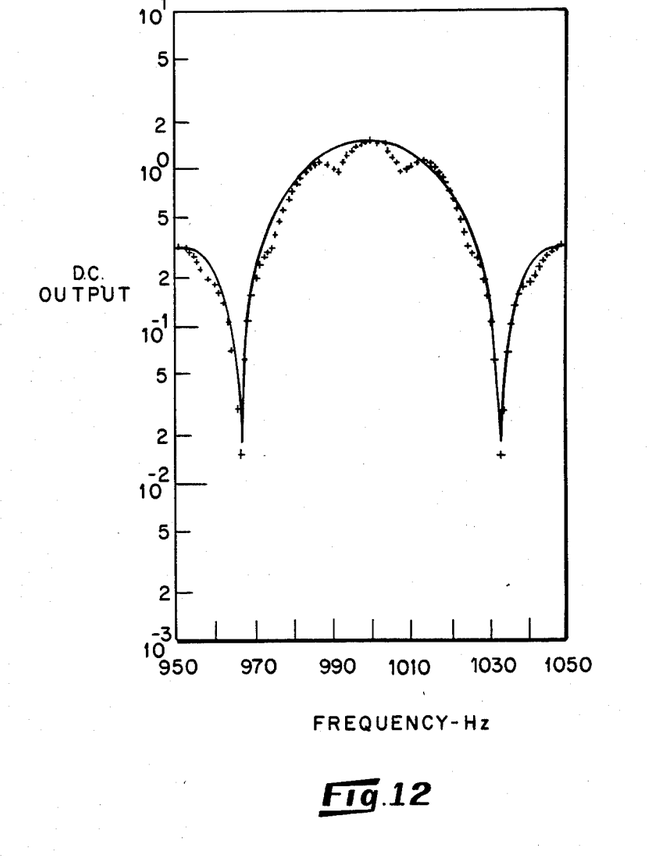

A more desirable response function results when using the larger of the absolute values of the outputs of integrators 24 and 38. Such response is always equal to or less than the "vector sum". The response curves of the "vector sum" and the larger of the absolute values for the circuit using an integrating time of 30 cycles shown over a frequency range of 950 to 1,050 hertz are depicted in FIG. 12. The solid line represents the "vector sum" response and the "plus" symbols in FIG. 12 depict the response of the circuit using the larger of the absolute values of the outputs of integrators 24 and 38. It will be noted that the sharp drop in response such as occurred using the sum of absolute values does not occur when using the larger of the absolute values. The circuit for producing an output of the larger of the absolute values of the integrator outputs has been described in conjunction with FIG. 6. The response shown for the larger of the absolute values of the integrator outputs is less than the "vector sum" for some frequencies, but overall it is a much more desirable response than the sum of the absolute values. The algorithm for determining the larger of the absolute values, as previously described, can be performed rapidly and cheaply and would be preferred for many applications.

Although particular embodiments have been described in the foregoing detailed description, it will be understood that the invention is capable of many rearrangements, modifications and substitutions of parts without departing from the scope of the invention. Circuit parameters such as integrating times and threshold levels will be chosen so that linear circuits stay in their linear range. For example, the outputs of the integrators 24 and 38 increase linearly with time for frequencies very close to the integrating frequency, so they should not be allowed to saturate for long integrating times. The detailed description has generally assumed the use of sine waves, but square waves could be substituted for the interrogating sine waves. In such case, since square waves contain all of the odd harmonics of the interrogating frequency, aliasing will occur at these frequencies, but in some applications, such aliasing is not disqualifying.

What is claimed is:

1. A frequency detector for detecting in an input signal the presence of signals within a selected frequency bandwidth of a selected interrogation frequency, comprising:

oscillator means for generating an interrogation signal having the selected interrogation frequency;

first multiplier means for multiplying the input signal and the interrogation signal to produce a first multiplier signal;

first integration means for integrating the first multiplier signal over a predetermined time interval to produce a first integration signal which corresponds to the presence of an input signal within the bandwidth of the interrogation frequency, said predetermined time interval being inversely proportional to the bandwidth such that one-half the bandwidth is approximately equal to the interrogation frequency divided by the number of interrogation frequency cycles in the predetermined time interval; and analyzing means for receiving and analyzing the first integration signal to determine the presence of the selected interrogation frequency in the input signal.

2. The frequency detector of claim 1 wherein said analyzing means comprises:

first absolute value means for receiving the first integration signal and for producing a first absolute value signal corresponding to the absolute value of the first integration signal; and, a threshold detector for receiving the first absolute value signal and producing a detection signal to indicate the presence of the interrogation frequency when the first absolute value signal exceeds a predetermined threshold level.

3. A frequency detector for detecting the presence of a selected interrogation frequency in an input signal, comprising:

oscillator means for generating an interrogation signal having the selected interrogation frequency;

first multiplier means for multiplying the input signal and the interrogation signal to produce a first multiplier signal;

first integration means for integrating the first multiplier signal over a predetermined time interval to produce a first integration signal;

analyzing means for receiving and analyzing the first integration signal to determine the presence of the selected interrogation frequency in the input signal, said analyzing means comprising:
- a first positive comparator for receiving the first integration of signal to produce a first presence signal in response to the presence of a positive first integration signal;
- a first negative comparator for receiving the first integration signal to produce a second presence signal in response to the presence of a negative first integration signal; and,
- a first "or" gate for receiving the first and second presence signals and for producing a first "or" signal in response to the first presence signal or the second presence signal.

4. The frequency detector of claim 1 further comprising:
- a phase shifter for receiving the interrogation signal and producing a 90° phase shifted interrogation signal;
- second multiplier means for multiplying the input signal and the 90° phase shifted interrogation signal to produce a second multiplier signal;
- second integration means for integrating the second multiplier signal over a predetermined time interval to produce a second integration signal; and,
- said analyzing means receiving and analyzing the first and second integration signals to determine the presence of the selected interrogation frequency in the input signal and for generating a detection signal to indicate the presence of the selected interrogation frequency.

5. The frequency detector of claim 4 further comprising a phase detector circuit responsive to the output of at least one of said multiplier signals to produce a phase signal having a magnitude corresponding to a trigonometric function of the phase difference between the interrogation signal and that portion of the input signal at the interrogation frequency.

6. The frequency detector of claim 4 wherein said analyzing means comprise:
- a first positive comparator for receiving the first integration signal to produce a first presence signal in response to the presence of a positive first integration signal;
- a first negative comparator for receiving the first integration signal to produce a second presence signal in response to the presence of a negative first integration signal;
- a second positive comparator for receiving the second integration signal to produce a third presence signal in response to the presence of a positive second integration signal;
- a second negative comparator for receiving the second integration signal to produce a fourth presence signal in response to the presence of a negative second integration signal; and,
- "or" means responsive to the first, second, third or fourth presence signals to produce an "or" signal to indicate the presence of the interrogation frequency in the input signal.

7. The frequency detector of claim 4 wherein said analyzing means comprises:
- first and second squaring means for receiving the first and second integration signals, respectively, and for producing first and second squared signals corresponding, respectively, to the squares of the first and second integration signals;
- an adding circuit for adding the first and second squared signals to produce a sum signal; and,
- a square root circuit for taking the square root of the sum signal to produce a vector sum signal having a magnitude corresponding to the Fourier Transform of the input signal with respect to the interrogation signal.

8. The frequency detector of claim 7 further comprising a divider for receiving and dividing the first integrator signal by the vector sum signal to produce a cosine signal corresponding to the cosine of the phase difference between the interrogation signal and that portion of the input signal at the interrogation frequency.

9. The frequency detector of claim 7 further comprising a divider for receiving and dividing the second integrator signal by the vector sum signal to produce a sine signal corresponding to the sine of the phase difference between the interrogation signal and that portion of the input signal at the interrogation frequency.

10. The frequency detector of claim 4 wherein said analyzing means comprises:
- first and second absolute value circuits for receiving, respectively, the first and second integration signals and producing first and second absolute value signals corresponding, respectively, to the absolute values of the first and second integration signals; and,
- an adding circuit for receiving and adding the first and second absolute value signals to produce an absolute sum signal to indicate the presence of the interrogation frequency in the input signal.

11. The frequency detector of claim 4 wherein said analyzing means comprises:
- first and second absolute value circuits for receiving, respectively, the first and second integration signals and producing first and second absolute value signals corresponding, respectively, to the absolute value of the first and second integration signals; and,
- a greater value circuit for receiving the first and second absolute value signals and for producing a greater value signal corresponding in magnitude to the greater value of the magnitudes of the first and second absolute value signals.

12. The frequency detector of claim 4 wherein said analyzing means comprises:
- third multiplier means for mixing the first integration signal and the interrogation signal to produce a third multiplier signal;
- fourth multiplier means for multiplying the second integration signal and the 90° phase shifted interrogation signal to produce a fourth multiplier signal; and
- summation means for adding the third and fourth multiplier signal to produce a sum signal corresponding in magnitude to the magnitude of that portion of the input signal having the interrogation frequency.

13. The frequcy detector of claim 12 further comprising a rectifier for rectifying the sum signal.

14. A detector circuit for comparing a selected interrogation signal having a selected interrogation frequency with an input signal to detect signals in the input signal that are within a selected frequency bandwidth of the interrogation frequency, comprising:

an oscillator for generating the interrogation signal at the selected interrogation frequency and for generang a phase shifted interrogation signal at the selected interrogation frequency phase shifted 90° with respect to the interrogation signal;

first multiplier means for multiplying the input signal and the interrogation signal to produce a first multiplier signal;

second multiplier means for multiplying the input signal and phase shifted interrogation signal to produce a second multiplier signal;

first integration means for integrating the first multiplier signal over a predetermined time interval to produce a first integration signal;

second integration means for integrating the second multiplier signal over the predetermined time interval to produce a second integration signal, said predetermined time interval being inversely proportional to the bandwidth such that one-half the bandwidth is approximately equal to the interrogation frequency divided by the number of interrogation frequency cycles in the predetermined time interval; and analyzing means for receiving and analyzing the first and second integration signals to produce a phase signal corresponding to the phase difference between the interrogation signal and that portion of the input signal at the interrogation frequency.

15. A method for determining the presence in an input signal of a signal within a selected bandwidth of a selected interrogation frequency comprising:

producing an interrogation signal at the selected interrogation frequency;

multiplying the input signal and the interrogation signal to produce a first multiplied signal;

integrating the first multiplied signal for a predetermined time interval to produce a first integration signal corresponding to the presence of signal in the input signal having the interrogation frequency, said predetermined time interval being inversely proportional to the bandwidth such that one-half the bandwidth is approximately equal to the interrogation frequency divided by the number of interrogation frequency cycles in the predetermined time interval; and analyzing the first integration signal to determine the presence of a signal within the selected bandwidth of the interrogation frequency in the input signal.

16. The method of claim 15 further comprising:

phase shifting the interrogation signal to produce a phase shifted interrogation signal at the selected interrogation frequency that is phase shifted by a selected phase angle with respect to the interrogation signal;

multiplying the phase shifted interrogation signal and the input signal to produce a second multiplied signal;

integrating the second multiplied signal for a predetermined time interval to produce a second integration signal; and analyzing the first and second integration signals to determine the presence of the interrogation frequency in the input signal.

17. The method of claim 16 wherein the step of analyzing the first and second integration signals comprises:

determining the absolute values of the first and second integration signals;

selecting the greater of the absolute values of the first and second integration signals; and comparing the greater of the absolute values of the first and second integration signals to a preselected threshold value to determine the presence of the interrogation frequency in the input signal.

18. The method of claim 16 further comprising:

comparing the first and second integration signals to determine the phase angle between the interrogating signal and the input signal.

19. The method of claim 16 wherein the analyzing step comprises:

squaring the first integration signal to produce a first squared signal;

squaring the second integration signal to produce a second squared signal;

adding the first and second squared signals to produce the sum of the squares signal; and taking the square root of the sum of the squares signal to produce a vector sum signal whose magnitude corresponds to the magnitude of that portion of the input signal at the interrogation frequency.

20. The method of claim 19 further comprising:

dividing the first integrator signal by the vector sum signal to produce a cosine signal whose magnitude corresponds to the cosine of the phase difference between the interrogation signal and that portion of the input signal at the interrogation frequency.

21. The method of claim 19 further comprising:

dividing the second integrator signal by the vector sum signal to produce a sine signal whose magnitude corresponds to the sine of the phase difference between the interrogation signal and that portion of the input signal at the interrogation frequency.

* * * * *

UNITED STATES PATENT AND TRADEMARK OFFICE
CERTIFICATE OF CORRECTION

PATENT NO. : 4,504,786

DATED : March 12, 1985

INVENTOR(S) : Grimes G. Slaughter

It is certified that error appears in the above-identified patent and that said Letters Patent is hereby corrected as shown below:

Column 6, line 26, after "(t)" should be -- as: --.

Column 7, line 53, "valve" should be -- value --.

Column 10, line 53, "vectcr" should be -- vector --.

Column 14, line 62, "frequcy" should be -- frequency --.

Column 15, line 3, "rang" should be -- rating --.

Signed and Sealed this

Eighteenth Day of June 1985

[SEAL]

Attest:

DONALD J. QUIGG

Attesting Officer   Acting Commissioner of Patents and Trademarks